United States Patent [19]

Yoshikawa

[11] Patent Number: 4,745,609
[45] Date of Patent: May 17, 1988

[54] STABILIZED LASER DEVICE

[75] Inventor: Shozi Yoshikawa, Tokyo, Japan

[73] Assignee: Olympus Optical Co., Ltd., Tokyo, Japan

[21] Appl. No.: 814,613

[22] Filed: Dec. 30, 1985

[30] Foreign Application Priority Data

Jan. 17, 1985 [JP] Japan .................................. 60-6123

[51] Int. Cl.[4] ............................................. H01S 3/13
[52] U.S. Cl. ...................................... 372/29; 372/31; 372/38
[58] Field of Search ............................ 372/29, 31, 38; 250/205

[56] References Cited

U.S. PATENT DOCUMENTS

| | | | |
|---|---|---|---|
| 4,344,173 | 8/1982 | Straus | 372/38 |
| 4,577,320 | 3/1986 | Yoshikawa et al. | 372/29 |
| 4,580,044 | 4/1986 | Hongo et al. | 250/205 |

FOREIGN PATENT DOCUMENTS

| | | |
|---|---|---|
| 0061034 | 9/1982 | European Pat. Off. . |
| 0096341 | 12/1983 | European Pat. Off. . |
| 3102185A | 11/1981 | Fed. Rep. of Germany . |
| 340444A | 8/1984 | Fed. Rep. of Germany . |

Primary Examiner—James W. Davie
Attorney, Agent, or Firm—Frishauf, Holtz, Goodman & Woodward

[57] ABSTRACT

A stabilized laser device has a semiconductor laser, an optical detector for performing photoelectrical conversion of laser light from the laser and producing a detection signal, and a variable voltage power source for outputting an analog voltage signal as a preset value for the laser output light. A differential amplifier produces a differential signal representing the difference between the detection signal and the preset analog voltage signal, and a gate circuit supplies a clock pulse from a clock pulse generator to one of the up and down terminals of an up/down counter in accordance with the output signal from the differential amplifier. A D/A converter converts the output digital signal from the counter to an analog signal and supplies it to a driver circuit for the laser. The D/A converter generates an analog signal which corresponds to the product of the output digital signal from the counter and the preset analog voltage signal from the variable voltage power source.

7 Claims, 2 Drawing Sheets

STABILIZED LASER DEVICE

BACKGROUND OF THE INVENTION

The present invention relates to a stabilized laser device in which laser light from a semiconductor laser or the like is automatically controlled and stabilized at a desired level.

A laser device, such as a semiconductor laser or the like, is used in an optical recording/reproducing apparatus for recording/reproducing information at high density or in an optical communication system. Light output from the laser device varies widely in accordance with external factors such as ambient temperature. The laser output also changes with degradation of the light source. Therefore, a laser device must have a light output stabilized device for stabilizing the laser output and improving reliability.

FIG. 1 shows a conventional stabilized laser device. Output light (from the rear surface of the laser, in this case) from semiconductor laser 301 is photoelectrically converted by photodiode 302, which produces a voltage signal. The output signal from photodiode 302 is supplied to the inverting input terminal of differential amplifier 303. The non-inverting input terminal of differential amplifier 303 receives reference voltage Vr as a preset value for output light. The output terminal of differential amplifier 303 is connected to window comparator 304. Window comparator 304 comprises comparators 304a and 304b which compare the output signal from differential amplifier 303 with preset upper and lower limits $th_u$ and $th_l$. Comparison results are then supplied to up and down terminals U and D of up/down counter 307 through gate circuit 305, consisting of AND gates 305a and 305b. Gate circuit 305 also receives clock pulses from clock pulse generator 306. The count of counter 307 is supplied to drive transistor 313 through D/A converter 308 and amplifier 310. The collector current of transistor 313 is then supplied to semiconductor laser 301.

More specifically, in such a stabilized laser device, reference voltage Vr is preset corresponding to the desired output of laser 301. Amplifier 303 supplies the difference voltage between the output light from laser 301 and reference voltage Vr to comparator 304. Comparator 304 generates an output which corresponds to the polarity of the difference voltage between the output light from laser 301 and reference voltage Vr.

When the output voltage from photodiode 302 is smaller than reference voltage Vr, a detection signal "1" is supplied from comparator 304a to AND gate 305a and a clock pulse is supplied to up terminal U of counter 307 through AND gate 305a. Consequently, the count of counter 307 increases, and the drive current supplied from the collector of drive transistor 313 to laser 301 also increases. The output light from laser 301 is thus increased so that the output of the photodiode 302 equals reference voltage Vr. On the other hand, if the output voltage from photodiode 302 is larger than reference voltage Vr, a detection signal "1" is supplied from comparator 304b to AND gate 305b, and a clock pulse is supplied to down terminal D of counter 307 through AND gate 305b. Consequently, the count of counter 307 decreases, and drive current supplied from the collector of transistor 303 to laser 301 decreases. Thus, the output light from laser 301 decreases so that the output of the photodiode 302 equals reference voltage Vr. In this manner, since the drive current of laser 301 is controlled in accordance with the difference between its output and reference voltage Vr, the output light from laser 301 can be controlled in accordance with reference voltage Vr.

However, in the above conventional device, if preset reference voltage Vr is changed during use, a period from the time voltage Vr is changed to the time the drive current of laser 301 is stabilized (at a value corresponding to reference voltage Vr), corresponds to the magnitude of change of reference voltage Vr and the clock pulse frequency. In other words, if the magnitude of change of reference voltage Vr is large, time for approximating the drive current to a value corresponding to reference voltage Vr is long. Because of this, in conventional stabilized laser devices, changes in the laser drive current in response to changes in the preset reference value are slow. Therefore, laser output is too large or too small for a period of time until the drive current controls it to equal the preset value. For example, then, recording state is unstable when information is written in a recording medium.

SUMMARY OF THE INVENTION

It is an object of the present invention to provide a stabilized laser device which can instantaneously change laser output when a preset value for the laser output is changed.

The above object of the present invention can be achieved by a stabilized laser device comprising laser means, optical detection means for photoelectrically converting laser light from the laser means and generating a detection signal, control signal generating means for multiplying a signal corresponding to an increasing or decreasing difference between the detection signal from the optical detection means and a preset signal for laser light generated by the laser means by the preset signal, and for generating a corresponding control signal, and drive means for driving the laser means in accordance with the control signal.

DETAILED DESCRIPTION OF THE PREFERRED EMBODIMENTS

An embodiment of the stabilized laser device according to the present invention will be described with reference to the accompanying drawings.

Figure 1:
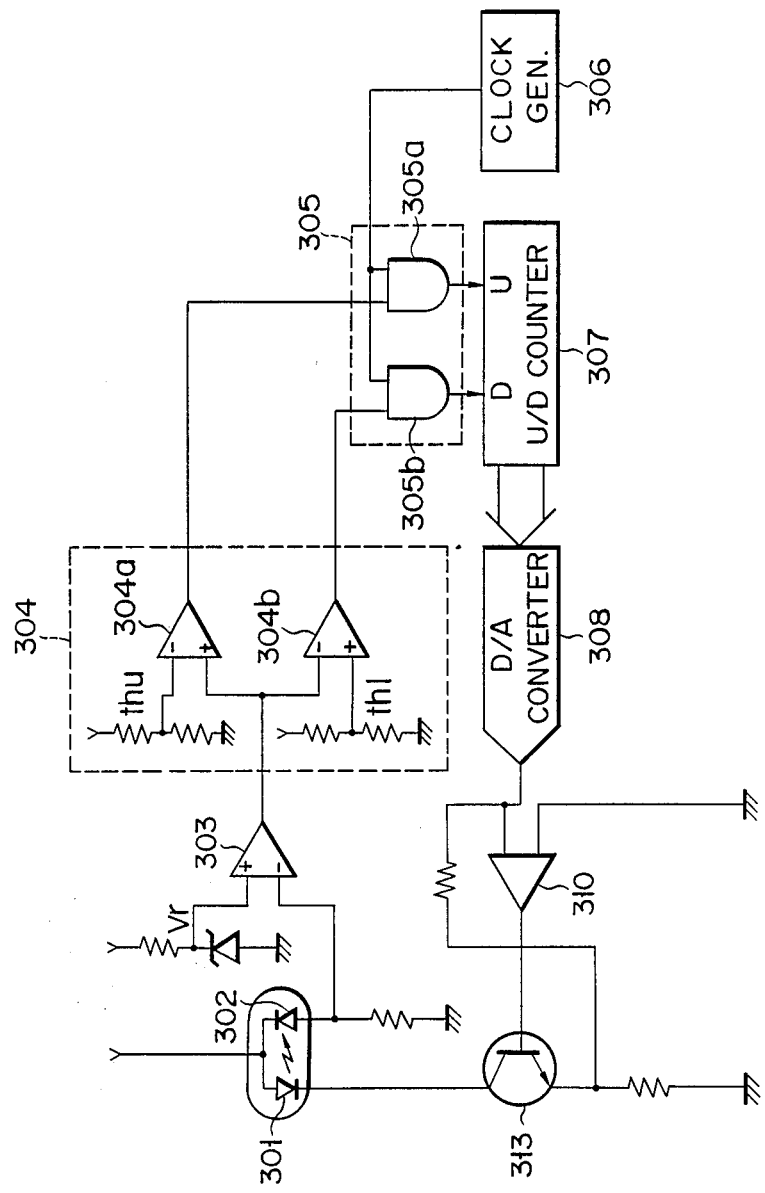
FIG. 1 is a circuit diagram of a conventional stabilized laser device.
Figure 2:
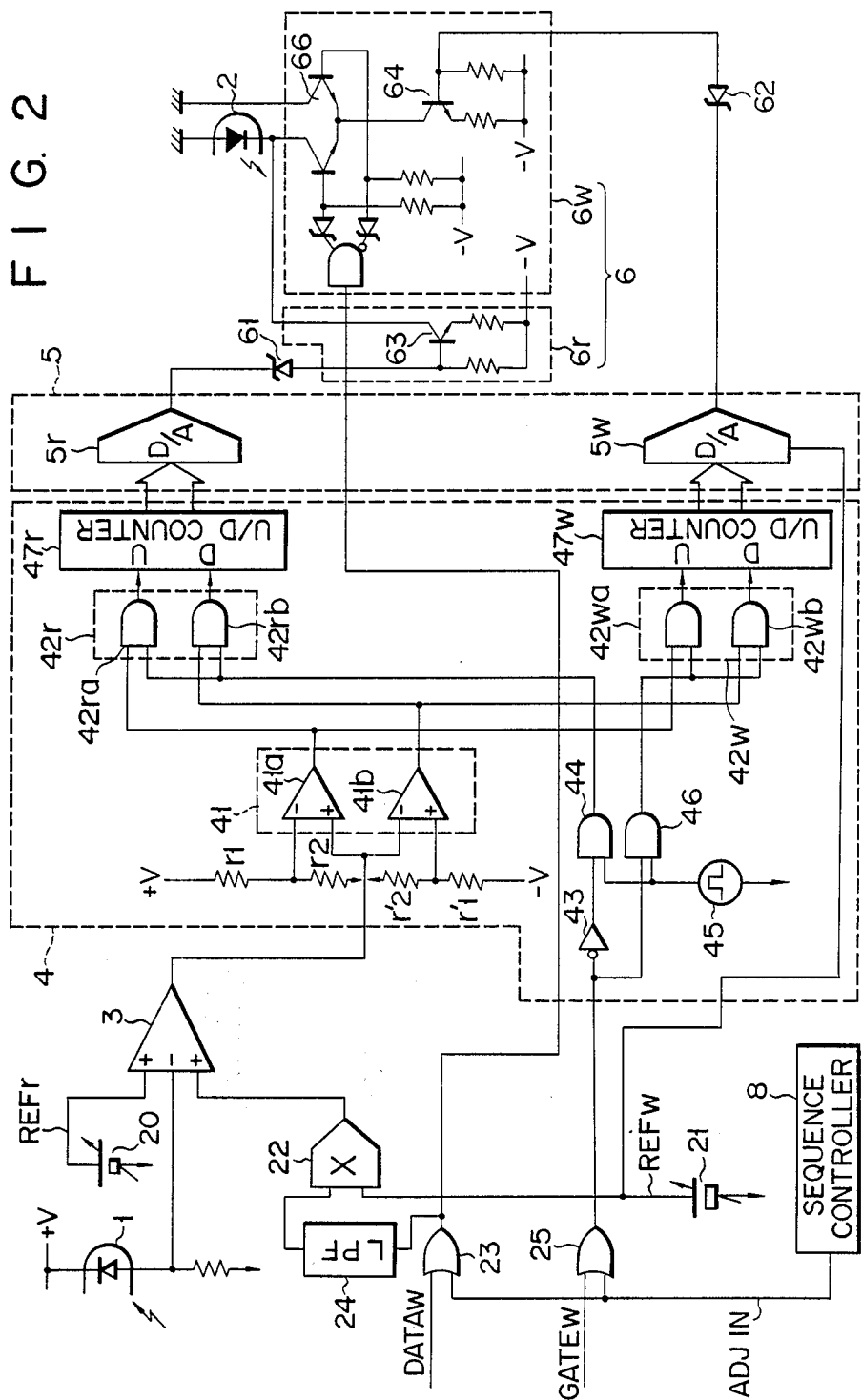
FIG. 2 is a circuit diagram of a stabilized laser device according to an embodiment of the present invention.

FIG. 2 is a circuit diagram of the device of this embodiment. This device is used in an optical information recording/reproduction apparatus using an optical disk. In such a recording/reproduction apparatus, laser output must be changed in accordance with the recording or reproduction mode. For this reason, the device has two control systems, as indicated by suffixes w and r. Since the optical disk is rotated at a constant angular speed, linear speed with respect to the laser beam increases and the laser beam intensity per unit area becomes weaker toward the outer track positions. In order to obtain a constant laser beam intensity per unit area at any track position, the laser output must be increased toward outer track positions. In the reproduction mode, changes in laser beam intensity per unit area for each track are not critical. Therefore, in this embodiment, laser light output is controlled in accordance with the track position only in the recording mode.

The device of this embodiment has, in general, semiconductor laser (e.g., laser diode) 2, photodiode (e.g., PIN diode) 1, differential amplifier 3, control signal generator 4, D/A converter circuit 5, and driver 6.

Photodiode 1 is normally formed integrally with laser 2. Photodiode 1 photoelectrically converts light emerging from the rear surface of laser 2 and produces a voltage signal. Since the intensity of light emerging from the front and rear surfaces of laser 2 is expected to be proportional, light emerging from the rear surface can be assumed to be equivalent to output light from the front surface, which is used for recording or reproduction. However, when precision is of more importance, a half mirror or the like can be inserted in the light path of the front surface of laser 2 so that part of the output light for recording/reproduction is incident on photodiode 1.

Differential amplifier 3 has one inverting input terminal and two non-inverting input terminals. Reproduction reference voltage REFr from variable power source 20 is applied to the first non-inverting input terminal of differential amplifier 3. Recording reference voltage REFw (higher than reference voltage REFr) from variable power source 21 is applied to the second non-inverting terminal of differential amplifier 3 through multiplier 22. Recording (binary) data DATAw is also supplied to multiplier 22 through OR gate 23 and low-pass filter 24. Therefore, only when recording data DATAw (level "1") is supplied to multiplier 22, recording reference voltage REFw is applied to differential amplifier 3. Low-pass filter 24 is used to average recording data DATAw so that the influence of changes in duty factor of data DATAw to the whole system is eliminated. However, when frequency response of multiplier 22 is fast, low-pass filter 24 can be omitted.

Differential amplifier 3 generates an output signal corresponding to the difference between the input at its inverting input terminal and the sum of inputs at the first and second non-inverting input terminals. The output from differential amplifier 3 is supplied to window comparator 41 in control signal generator 4, which has comparators 41a and 41b. The output from differential amplifier 3 is supplied to the non-inverting input terminal of comparator 41a and to the inverting input terminal of comparator 41b. A positive reference voltage obtained by dividing positive voltage +V with resistors r1 and r2 is applied to the inverting input terminal of comparator 41a. A negative reference voltage obtained by dividing negative voltage −V with resistors r1' and r2' is applied to the non-inverting input terminal of comparator 41b.

The output signals from window comparator 41 are supplied to gate circuit 42r of the reproduction system and gate circuit 42w of the recording system. Each gate circuit has two AND gates. The output from comparator 41a, to which the positive reference voltage is applied, is applied to the first input terminals of AND gates 42ra and 42wa. The output from comparator 41b, to which the negative reference voltage is applied, is applied to the first input terminals of AND gates 42rb and 42wb.

A clock pulse from generator 45 is applied to the second input terminals of AND gates 42ra and 42rb through AND gate 44. The clock pulse from generator 45 is applied to the second input terminals of AND gates 42wa and 42wb through AND gate 46. AND gate 44 also receives recording gate signal GATEw through OR gate 25 and inverter 43. AND gate 46 receives gate signal GATEw through OR gate 25. Adjustment instruction $ADJ_{IN}$ from sequence controller 8 is also supplied to OR gates 23 and 25. Sequence controller 8 (comprising Intel. 8051 CPU) outputs adjustment instruction $ADJ_{IN}$ when laser output is preset at a given value before recording takes place.

Outputs from gate circuits 42r and 42w are supplied to up/down counters 47r and 47w of the reproduction and recording systems. The outputs from AND gates 42ra and 42wa are supplied to up terminals U of counters 47r and 47w, respectively. The outputs from AND gates 42rb and 42wb are respectively supplied to down terminals D of counters 47r and 47w. The outputs from counters 47r and 47w are then supplied to corresponding D/A converters 5r and 5w of circuit 5. Converters 5r and 5w are multiplying D/A converters (such as MC1408 and MC1508, Motorola), have digital and analog input terminals, and calculate products of the inputs received therefrom.

As mentioned previously, in this embodiment laser output is controlled in accordance with track position only in the recording mode. Therefore, the analog input voltage of D/A converter 5r is fixed, and recording reference voltage REFw is supplied to the analog input terminal of converter 5w. The output voltage from converter 5w is multiplied by a coefficient corresponding to recording reference voltage REFw.

The output terminals of D/A converters 5r and 5w are connected to drivers 6r and 6w. The output signal from D/A converter 5r is supplied to drive transistor 63 of driver 6r through Zener diode 61. The collector current of drive transistor 63 is supplied to laser 2. The output signal from converter 5w is supplied to transistor 64 of driver 6w through Zener diode 62. The collector current of transistor 64 is then supplied to laser 2 through transistor pair 66. Pair 66 is ON/OFF controlled by recording data DATAw and adjustment instruction $ADJ_{IN}$, supplied through OR gate 23.

The operation of this embodiment will be described below. Assume that the reproduction mode is automatically set upon power on of the device. When the device is energized, recording reference voltage REFr rises to a predetermined level.

Since recording data DATAw is at level "0" in the reproduction mode, transistor pair 66 is turned off, and the drive current from driver 6r alone is supplied to laser 2. Since the output from multiplier 22 is at level "0", reference voltage REFw is not applied to differential amplifier 3.

In addition, since recording gate signal GATEw is at level "0", AND gate 44 is turned on and AND gate 46 is turned off. The clock pulse from generator 45 is then supplied to gate circuit 42r through AND gate 44. Gate circuit 42w is disabled.

Immediately after the device is energized, the count of counter 47r and the output from D/A converter 5r are small, the drive current from driver 6r is also small, and laser 2 is not illuminated. For this reason, the output signal from photodiode 1 is at low level.

Differential amplifier 3 generates a differential voltage representing the difference between reference voltage REFr and the output voltage from photodiode 1. The output signal from amplifier 3 is thus at high level. Since the differential voltage is larger than the positive reference voltage obtained by dividing positive voltage +V with resistors r1 and r2, a detection signal "1" is supplied from comparator 41a to AND gate 42ra. As a result, the clock pulse is supplied to up count terminal U of up/down counter 47r through AND gate 42ra. Since the output signal from differential amplifier 3 is larger than the negative voltage obtained by dividing negative voltage −V with resistors r1' and r2', a detection signal "0" is supplied from comparator 41b to AND gate 42rb. As a result, no clock pulse is generated through AND gate 42rb.

When the count of counter 47r and the output from D/A converter 5r thus increase gradually, the drive current from driver 6r is also increased. When the drive current from driver 6r exceeds a predetermined threshold volue, light is emitted from laser 2.

Thereafter, the output signal from photodiode 1 increases, and the output from differential amplifier 3 decreases until the output from photodiode 1 becomes equal to REFr.

Thereafter, sequence controller 8 produces adjustment instruction $ADJ_{IN}$ of level "1". Instruction $ADJ_{IN}$ is supplied to the base of pair 66, to turn it on. Since instruction $ADJ_{IN}$ is also supplied to multiplier 22 through low-pass filter 24, recording reference voltage REFw is supplied to differential amplifier 3. Instruction $ADJ_{IN}$ is further supplied to AND gate 46 through OR gate 25, and the clock pulse from generator 45 is supplied to gate circuit 42w through AND gate 46.

Differential amplifier 3 produces a differential voltage representing the difference between reference voltage REFw and the output voltage from photodiode 1. When this differential voltage is larger than the positive reference voltage obtained by dividing positive voltage +V with resistors r1 and r2, a detection signal "1" is supplied from comparator 41a to AND gate 42wa. As a result, a clock pulse is supplied to up terminal U of counter 47w through AND gate 42wa. On the other hand, when the differential voltage is smaller than the negative voltage obtained by dividing negative voltage −V with resistors r1' and r2', comparator 41b supplies a detection signal "1" to AND gate 42wb. As a result, a clock pulse is supplied to down terminal D of counter 47w through AND gate 42wb.

When reference voltage REFw is larger than the output voltage from photodiode 1, the count of counter 47w increases, and when the output from photodiode 1 is larger than reference voltage REFw, the count decreases. Therefore, the output from D/A converter 5w increases/decreases in accordance with the difference between the output voltage from photodiode 1 and reference voltage REFw, thus drive current and output light of laser 2 are controlled to correspond to reference voltage REFw. When initial adjustment of the output from laser 2 is completed, supply of instruction $ADJ_{IN}$ from sequence controller 8 is disabled.

The recording mode will now be described. In this mode, reference voltage REFw is set according to the track position. Since gate signal GATEw is at level "0", a clock pulse from generator 45 is supplied to gate circuit 42r through AND gate 44. Thereby, the count of counter 47r is set at a value corresponding to reference voltage REFr. Next, gate signal GATEw is set at level "1", and the clock pulse from generator 45 is supplied to gate circuit 42w through AND gate 46. The count of counter 47w is increased or decreased in accordance with the output from differential amplifier 3. Since recording data DATAw is supplied to pair 66, drive currents from drivers 6w and 6r are supplied to laser 2 in accordance with level "1" or "0" of data DATAw. Since reference voltage REFr is larger than reference voltage REFw, laser beams of high or low intensities are radiated to form or not to form pits on a recording medium when recording data DATAw is "1" or "0", respectively.

The operation for writing data onto the optical disk will be described. When recording data and its write address are supplied, the apparatus is first switched to the reproduction mode (i.e., recording gate signal GATEw is set at level "0"). Laser light of the reproduction level is radiated on the optical disk, and a head is shifted to a desired track position corresponding to the write address upon accessing of addresses on the disk. Next, the apparatus is switched to the recording mode (recording gate signal GATEw is set at level "1"). The sum of the drive currents from drivers 6w and 6r or the drive current from driver 6r alone is supplied to laser 2 in accordance with levels "1" or "0" of recording data DATAw. As a result, laser beams of high and low intensities are radiated to form or not form pits on the optical disk when recording data DATAw is "1" or "0".

A description of device operation when the position of the recording track is changed and the laser output is thus changed will now be made. For this example, the value of reference voltage REFw is changed in accordance with the track position. For the sake of simplicity, the laser output for the recording system, i.e., reference voltage REFw is multiplied by m. In this embodiment, since reference voltage REFw is supplied to the analog input terminal which determines the multiplying coefficient of D/A converter 5w, when reference voltage REFw is multiplifed by m, the multiplying coefficient of D/A converter 5w and the output analog voltage are instantaneously multiplied by m. In the conventional apparatus, a period, from the time at which reference voltage REFw is changed to the time at which the laser output reaches a value corresponding to new reference voltage REFw, corresponds to the time required for counter 47w to count to a value corresponding to the difference between the new reference voltage REFw and the old reference. Therefore, the time period is prolonged if the magnitude of change in reference voltage REFw is large. In contrast to this, according to the present invention, since the multiplying coefficient of D/A converter 5w for generating an analog voltage corresponding to the output from counter 47w is changed in accordance with changes in reference voltage REFw, the drive current can be updated immediately after the reference voltage is changed. Therefore, the updating of the drive current for the laser in accordance with changes in reference value REFw is not delayed, laser output deficiency during such updating does not occur, and stable recording can be achieved.

Another embodiment of the present invention will be described below. In the first embodiment, a variable coefficient multiplying D/A converter is used in order to allow the output from the D/A converter to change instantaneously. However, a constant coefficient multiplying D/A converter can be used. For example, an analog multiplier can be connected to the output terminal of the constant coefficient D/A converter, and the analog voltage output from the D/A converter can be multiplied by a coefficient varied in accordance with changes in the reference voltage, so as to obtain the same effect as that in the first embodiment. Alternatively, a digital multiplier can be inserted between an up/down counter and the D/A converter, so that the digital output signal from the counter is multiplied by a coefficient varied in accordance with changes in the reference voltage and then supplied to the constant D/A converter. The same effect can also be obtained with this arrangement.

Further, if the frequency of the clock pulse from the oscillator 45 may be varied in accordance with changes in the reference voltage, the output of the counter can be changed instantaneously.

In the above descriptions, laser output is changed in accordance with track position in the recording mode. However, the laser output can also be changed in accordance with track position in the reproduction mode, or it can be varied between the index and information sectors in the recording mode.

The information recording medium for the apparatus that contains the device of the present invention is not limited to disks and can be tapes, cards, or the like. Furthermore, the present invention is not limited to information recording/reproduction apparatuses, and can be applied to optical communication systems and the like.

As described above, according to the present invention, in a stabilized laser device for increasing/decreasing the count of an up/down counter in accordance with the difference between a preset value and a detected value for output light, and for controlling a drive current supplied to a light emitting means, the count is changed by multiplication of a suitable coefficient when the preset value is changed, so that the amount of output light can be changed instantaneously.

What is claimed is:

1. A stabilized laser device, comprising:
   laser means for generating laser light;
   optical detection means for photoelectrically converting the laser light from the laser means into a corresponding detection signal;
   means for presetting a reference signal corresponding to a desired output light from the laser means;
   means for outputting a differential signal representing a difference between said detection signal and the preset reference signal;
   arithmetic operating means for generating a control signal corresponding to a product of said differential signal and the preset reference signal; and
   drive means for driving the laser means in accordance with the control signal.

2. A stabilized laser device according to claim 1, in which the preset reference signal is an analog voltage signal produced by a variable voltage power source; and said arithmetic operating means comprises an up/down counter, a count of which changes in accordance with the differential signal, and D/A converting means for generating an analog signal corresponding to a product of a digital signal output from said up/down counter and the analog voltage signal produced by said variable voltage power source.

3. A stabilized laser device according to claim 2, in which said differential signal output means comprises a differential amplifier, a comparator for comparing an output from said differential amplifier with a reference signal and for generating a binary comparison signal, and a gate circuit for supplying a clock pulse to one of up and down terminals of said up/down counter in accordance with the comparison signal output from said comparator.

4. A stabilized laser device according to claim 1, in which the preset reference signal is an analog voltage signal produced from a variable voltage power source; and said arithmetic operating means comprises an up/down counter, a count of which is increased or decreased in accordance with the differential signal, D/A converting means for converting an output digital signal from said up/down counter to an analog signal, and a multiplier for multiplying an analog voltage signal from said D/A converting means with an analog voltage signal from said variable voltage power source.

5. A stabilized laser device according to claim 4, in which said differential signal output means comprises a differential amplifier, a comparator for comparing an output from said differential amplifier with a reference signal and for generating a binary comparison signal, and a gate circuit for supplying a clock pulse to one of up and down terminals of said up/down counter in accordance with the comparison signal output from said comparator.

6. A stabilized laser device according to claim 1, in which said preset reference signal is an analog voltage signal produced by a variable voltage power source; and said arithmetic operating means comprises an up/down counter for counting a clock pulse in an up-counting direction or down-counting direction in accordance with the differential signal, means for changing a frequency of the clock pulse counted by said up/down counter in accordance with the preset reference signal, and a D/A converter for converting a digital signal output from the up/down counter into said control signal.

7. A stabilized laser device according to claim 6, wherein said differential signal output means comprises a differential amplifier, a comparator for comparing an output from said differential amplifier with a reference signal and for generating a binary comparison signal, and a gate circuit for supplying a clock pulse to one of up and down terminals of said up/down counter in accordance with the comparison signal output from said comparator.

* * * * *